(12) United States Patent
Jo et al.

(10) Patent No.: US 10,770,530 B2
(45) Date of Patent: Sep. 8, 2020

(54) ORGANIC LIGHT EMITTING DISPLAY DEVICE

(71) Applicant: LG Display Co., Ltd., Seoul (KR)

(72) Inventors: Jang Jo, Paju-si (KR); Hye-Jin Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/222,707

(22) Filed: Dec. 17, 2018

(65) Prior Publication Data

US 2019/0198593 A1    Jun. 27, 2019

(30) Foreign Application Priority Data

Dec. 22, 2017  (KR) ........................ 10-2017-0177829

(51) Int. Cl.
*H01L 27/32* (2006.01)
*H01L 51/52* (2006.01)

(52) U.S. Cl.
CPC ...... *H01L 27/3258* (2013.01); *H01L 27/3211* (2013.01); *H01L 51/5203* (2013.01); *H01L 51/5209* (2013.01); *H01L 51/5215* (2013.01); *H01L 51/5218* (2013.01); *H01L 51/5225* (2013.01); *H01L 51/5237* (2013.01); *H01L 51/5271* (2013.01); *H01L 27/322* (2013.01); *H01L 27/326* (2013.01)

(58) Field of Classification Search
CPC ........................ H01L 51/5218; H01L 27/3258
See application file for complete search history.

(56) References Cited

U.S. PATENT DOCUMENTS

| | | | |
|---|---|---|---|
| 2010/0025664 | A1 | 2/2010 | Park |
| 2014/0312319 | A1* | 10/2014 | Kim ............... H01L 27/3258 257/40 |
| 2015/0236073 | A1 | 8/2015 | Chen et al. |
| 2017/0084677 | A1* | 3/2017 | Ha .................. H01L 27/3258 |
| 2017/0317148 | A1 | 11/2017 | Uchida et al. |
| 2018/0097195 | A1* | 4/2018 | Inoue ................ H05B 33/06 |

FOREIGN PATENT DOCUMENTS

| | | |
|---|---|---|
| JP | 2006-221902 A | 8/2006 |
| JP | 2010-10020 A | 1/2010 |
| JP | 2011-228229 A | 11/2011 |
| TW | I538193 B | 6/2016 |
| WO | WO 2016/167354 A1 | 10/2016 |
| WO | WO 2017/043529 A1 | 3/2017 |
| WO | WO 2017/094760 A1 | 6/2017 |

* cited by examiner

*Primary Examiner* — Farun Lu
(74) *Attorney, Agent, or Firm* — Birch, Stewart, Kolasch & Birch, LLP

(57) ABSTRACT

An organic light emitting display device includes a reflective electrode in a pixel region on a substrate and including a concave portion defining a concave furrow, a first filling pattern filling the concave furrow, a first electrode on the first filling pattern and on a portion of the reflective electrode around the first filling pattern, an organic light emitting layer on the first electrode, and a second electrode on the organic light emitting layer.

17 Claims, 4 Drawing Sheets

ORGANIC LIGHT EMITTING DISPLAY DEVICE

CROSS-REFERENCE TO RELATED APPLICATIONS

The present application claims the priority benefit of Korean Patent Application No. 10-2017-0177829 filed in the Republic of Korea on Dec. 22, 2017, which is hereby incorporated by reference in its entirety for all purposes as if fully set forth herein.

BACKGROUND OF THE INVENTION

Field of the Invention

The present invention relates to an organic light emitting display device (OLED).

Discussion of the Related Art

Recently, flat display devices being excellent in thin profile, lightweight and low power consumption have been developed and used widely.

Among the flat display devices, an organic light emitting display device (OLED) known as an organic electroluminescent display device is a display device in which an electron from a cathode and a hole from an anode are injected to an emitting layer between the cathode and the anode to generate an electron-hole pair, and the electron-hole pair disappears to emit a light.

Generally, a top emission type OLED includes a reflective electrode which is located below an organic light emitting layer and has a flat state, and a light, which is emitted from the organic light emitting layer and travels downward, is reflected by the reflective electrode.

However, a light having a great incident angle to the reflective electrode is output to a neighboring pixel region to cause a color mixture. Further, the light is totally reflected inside the organic light emitting panel and guided laterally to cause a loss of light.

SUMMARY OF THE INVENTION

Accordingly, the present invention is directed to an organic light emitting display device (OLED) that substantially obviates one or more of the problems due to limitations and disadvantages of the related art.

An object of the present invention is to improve an OLED which can improve (or reduce) a color mixture or light loss.

Additional features and advantages of the disclosure will be set forth in the description which follows, and in part will be apparent from the description, or can be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, an organic light emitting display device includes a reflective electrode in a pixel region on a substrate and including a concave portion defining a concave furrow, a first filling pattern filling the concave furrow, a first electrode on the first filling pattern and on a portion of the reflective electrode around the first filling pattern, an organic light emitting layer on the first electrode, and a second electrode on the organic light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Reference will now be made in detail to embodiments, examples of which are illustrated in the accompanying drawings. The same or like reference numbers can be used throughout the drawings to refer to the same or like parts.

Figure 1:
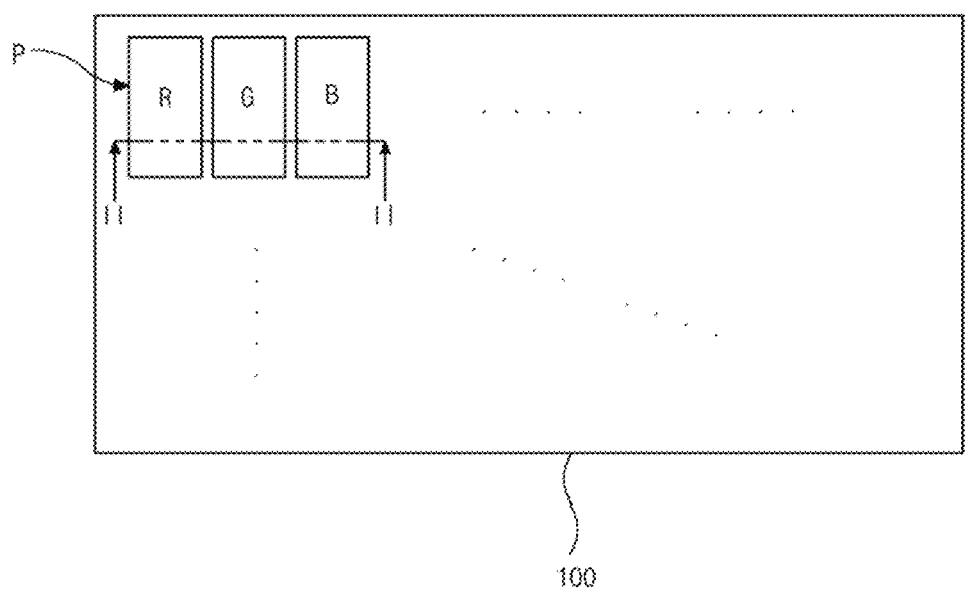
FIG. 1 is a plan view schematically illustrating an organic light emitting display device according to an embodiment of the present invention.
Figure 2:
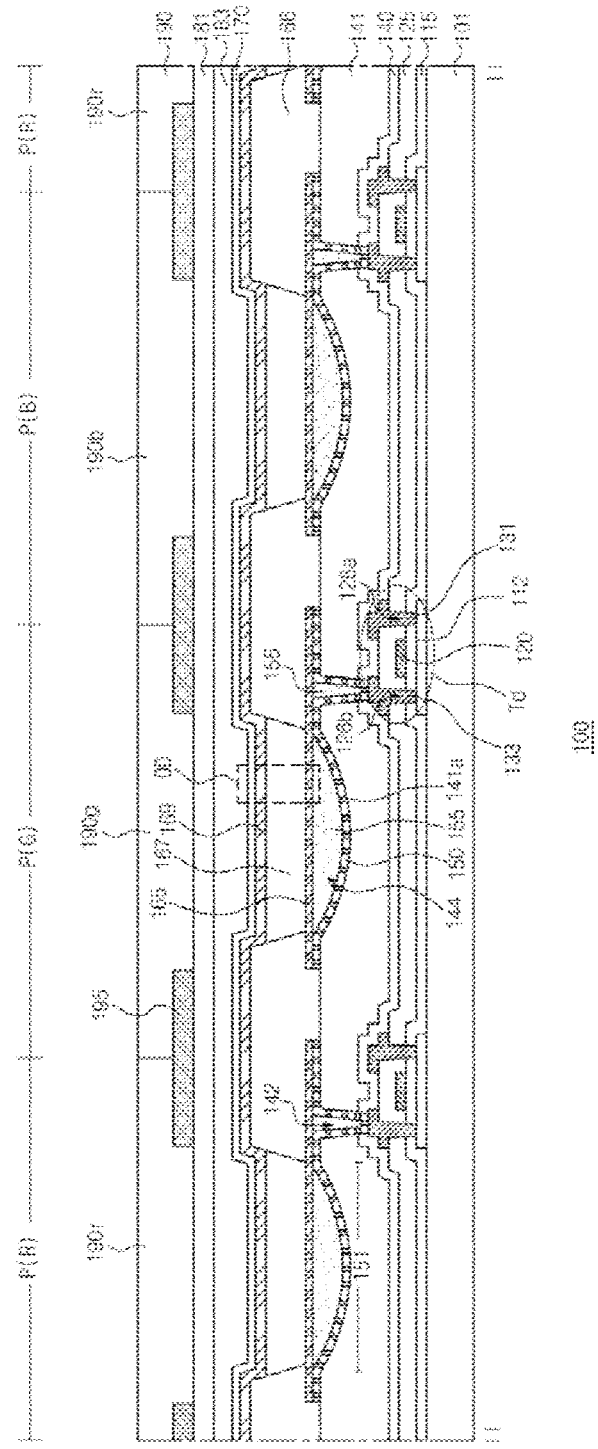
FIG. 2 is a cross-sectional view taken along a line II-II of FIG. 1.

FIG. 1 is a plan view schematically illustrating an organic light emitting display device (OLED) according to an embodiment of the present invention, and FIG. 2 is a cross-sectional view taken along a line II-II of FIG. 1. All the components of the OLED according to all embodiments of the present invention are operatively coupled and configured.

Referring to FIG. 1, an OLED 100 of this embodiment includes a plurality of pixel regions P in a display region to display images, and the plurality of pixel regions P are arranged in a matrix form.

The plurality of pixel regions P can include red (R), green (G) and blue (B) pixel regions P to respectively display red, green and blue colors. The red (R), green (G) and blue (B) pixel regions P can be arranged alternately along a direction.

A structure of the OLED 100 is explained in more detail further with reference to FIG. 2.

The OLED 100 can include two substrates, i.e., a first substrate 101 and a second substrate 181, facing each other. The first substrate 101 can be an array substrate, and include driving elements to operate each pixel region P.

The second substrate 181 is an opposing substrate to the first substrate 101. The second substrate 181 can serve as an encapsulation substrate to encapsulate the first substrate 101. Alternatively, the second substrate 181 can be omitted.

The OLED 100 can be a top emission type OLED. In this regard, a light is emitted upward from the first substrate 101 so that an outer surface of the second substrate 181 serves as a display surface (or light output surface).

Further, a circular polarization plate can be attached onto the outer surface of the second substrate 102 to improve the reflection of external light.

In each pixel region P of the first substrate 101, a switching thin film transistor (TFT), a driving TFT Td, and organic light emitting diode (OD) that is on the switching TFT and the driving TFT Td and is connected to the driving TFT Td can be disposed.

In more detail, a semiconductor layer 112 can be formed on an inner surface of the first substrate 101. The semiconductor layer 112 can be made of, for example, polysilicon, but is not limited thereto and can use other material(s).

An insulating layer, for example, a gate insulating layer 115 can be formed on the semiconductor layer 112. The gate insulating layer 115 can be formed entirely over the first substrate 101.

The gate insulating layer 115 can be made of an inorganic insulating material, for example, silicon oxide or silicon nitride.

A gate electrode 120 can be located on the gate insulating layer 115 and correspond to a center portion of the semiconductor layer 112. The gate electrode 120 can be made of a conductive material, for example, a metal material.

A gate line connected to a gate electrode of the switching TFT can be formed on the gate insulating layer 115.

An insulating layer, for example, an inter-layered insulating layer 125 can be formed on the gate electrode 120. The inter-layered insulating layer 125 can be formed entirely over the first substrate 101.

The inter-layered insulating layer 125 can be made of an inorganic insulating material, for example, silicon oxide or silicon nitride, or an organic insulating material, for example, benzocyclobutene or photo acryl.

The inter-layered insulating layer 125 can include a first contact hole 126a and a second contact hole 126b that respectively expose both sides of the semiconductor layer 112.

The first and second contact holes 126a and 126b are located at both sides of the gate electrode 120 and are spaced apart from the gate electrode 120. The first and second contact holes 126a and 126b can be also formed in the gate insulating layer 115.

A source electrode 131 and a drain electrode 133 can be formed on the inter-layered insulating layer 125. The source and drain electrodes 131 and 133 can be made of a conductive material, for example, a metal material.

A data line can be formed on the inter-layered insulating layer 125. The data line cross the gate line and is connected to a source electrode of the switching TFT.

The source and drain electrodes 131 and 133 are spaced apart from each other with the gate electrode 120 therebetween. The source and drain electrodes 131 and 133 can contact the both sides of the semiconductor layer 112 through the first and second contact holes 126a and 126b, respectively.

The semiconductor layer 112, the gate electrode 120, and the source and drain electrodes 131 and 133 form the driving TFT Td.

Alternatively, the driving TFT can have an inverted staggered structure in which a gate electrode is formed below a semiconductor layer, and source and drain electrodes are formed on the semiconductor layer. In this case, the semiconductor layer can be made of, for example, amorphous silicon.

The switching TFT can be formed to have the same structure as the driving TFT Td.

A first passivation layer 140 as an insulating layer can be formed on the source and drain electrodes 131 and 133. The first passivation layer 140 can be formed entirely over the first substrate 101.

The first passivation layer 140 can be made of an inorganic insulating material, for example, silicon oxide or silicon nitride.

A second passivation layer 141 as an insulating layer can be formed on the first passivation layer 140. The second passivation layer 141 can be formed entirely over the first substrate 101.

The second passivation layer 141 can be made of an organic insulating material, for example, benzocyclobutene or photo acryl.

The first and second passivation layers 140 and 141 can include a drain contact hole 142 exposing the drain electrode 133.

Alternatively, a single-layered passivation structure with the second passivation layer can be applied on the driving TFT Td.

The second passivation layer 141 can include a concave hollow in each pixel region P.

In this regard, a portion of the second passivation layer 141 corresponding to an light emission region where the organic light emitting diode OD is formed in the pixel region P has a top surface 141a which is dented downwardly (i.e., toward the first substrate 101) to have a concavely curved shape. This dented surface 141a is referred to as a concave surface 141a.

A space in a dented shape on the concave surface 141a is the concave furrow 144. Accordingly, the concave furrow 144 that is defined by the concave surface 141a (i.e., surrounded by the concave surface 141a) can be configured in the second passivation layer 141.

A portion of the second passivation layer 141 around (or surrounding) the concave furrow 144 can have a flat (or even) state. In other words, the portion of the second passivation layer 141 around the concave furrow 144 can have a flat top surface.

The second passivation layer 141 can be formed, for example, a photolithography process using a halftone mask.

A reflective electrode 150 is formed on the second passivation layer 141 in each pixel region P. The reflective electrode 150 can be connected to the drain electrode 133 through the drain contact hole 142.

A portion of the reflective electrode 150 located in the drain contact hole 142 can extend along inner surfaces of the drain contact hole 142 to contact the drain electrode 133.

The reflective electrode 150 can be formed in accordance with the concave furrow 144 of the second passivation layer 141.

Accordingly, a portion of the reflective electrode 150 formed in the concave furrow 144 can substantially have the same shape as the concave surface 141a.

In other words, the portion of the reflective electrode 150 in the concave furrow 144 can be formed along the concave surface 141a to substantially have the same shape as the concave surface 141a. This portion of the reflective electrode 150 in the concave furrow 144 is referred to as a concave portion 151.

Accordingly, the concave furrow 144 of the second passivation layer 141 can remain on the concave portion 151 of the reflective electrode 150.

In other words, the reflective electrode 150 can also include the concave furrow 144 located on the concave portion 151. That is, the concave portion 151 of the reflective electrode 150 can define the concave furrow 144.

Further, the reflective electrode 150 can be formed on the flat surface of the portion of the second passivation layer 141 around the concave surface 141a. The portion of the reflective electrode 150, which is on the flat surface of the portion of the second passivation layer 141 around the concave surface 141a, substantially has a flat shape.

The reflective electrode 150 can be made of a metal material having a high reflectivity such as silver (Ag). The reflective electrode 150 can have a single-layered or multi-layered structure.

If the the reflective electrode 150 has the multi-layered structure, a top layer of the reflective electrode 150 can be made of a metal material having a reflectivity, and a bottom layer of the reflective electrode 150 can be made of a conductive material having a high adhesion property, for example, ITO.

Figure 3:
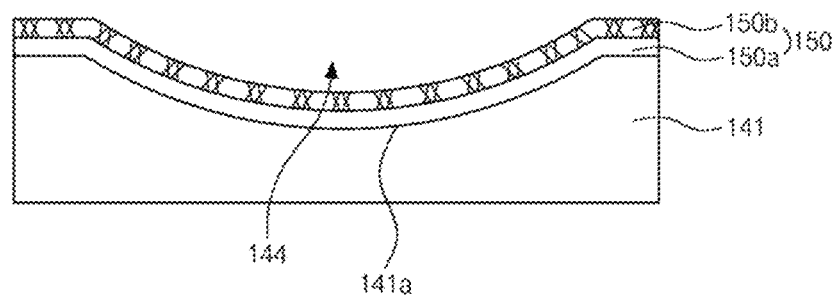
FIG. 3 is a cross-sectional illustrating a reflective of a two-layered structure according to an embodiment of the present invention.

In this regard, FIG. 3 shows the reflective electrode 150 of a two-layered structure as an example of a multi-layered structure.

Referring to FIG. 3, the reflective electrode 150 can include a first layer 150a as a lower layer which is made of a transparent conductive material such as ITO, and a second layer 150b as an upper layer which is made of a reflective metal material such as Ag.

Referring to FIGS. 2 and 3, a first filling pattern 155 can be formed on the reflective electrode 150. In detail, the first filling pattern 155 can be located on the concave portion 151 of the reflective electrode 150 and cover the concave portion 151.

The first filling pattern 155 can be configured to fully fill the concave furrow 144 in which the reflective electrode 150 is formed.

Accordingly, in the state that the first filling pattern 155 is formed, the concave furrow 144 and the surface of the first substrate 101 around the concave furrow 144 can be substantially flat.

In other words, since the first filling pattern 155 is formed to cover the concave portion 151 and fill the concave furrow 144, a flat top surface of the first filling pattern 155 and a flat top surface of the reflective electrode 150 around the first filling pattern 155 can substantially have the same height.

Further, a second filling pattern 156 can be formed on the reflective electrode 150 in the drain contact hole 142 to fill the drain contact hole 142.

Accordingly, in the state that the second filling pattern 156 is formed, the drain contact hole 142 and the surface of the first substrate 101 around the drain contact hole 142 can be substantially flat.

In other words, since the second filling pattern 156 is formed to fill the drain contact hole 142, a flat top surface of the second filling pattern 156 and a flat top surface of the reflective electrode 150 around the second filling pattern 156 can substantially have the same height.

The first and second filling patterns 155 and 156 can be made of an organic insulating material, for example, benzocyclobutene or photo acryl.

A first electrode 165 can be formed in each pixel region P on the first substrate 101 having the first and second filling patterns 155 and 156. The first electrode 165 can be made of a transparent conductive material, for example, ITO.

The first electrode 165 can contact the first filling pattern 155 and the portion of the reflective electrode 150 around the first filling pattern 155.

When the first electrode 165 is formed to contact the top surface of the portion of the reflective electrode 150 that is not covered by the first filling pattern 155 (or is exposed around the first filling pattern 155), the first electrode 165 is capable of being electrically connected to the drain electrode 133 through the reflective electrode 150.

Further, the first electrode 165 can contact the second filling pattern 156 and the portion of the reflective electrode 150 around the second filling pattern 155.

As described above, since the first substrate 101 having the first and second filling patterns 155 and 156 substantially has a flat surface, the first electrode 165 can be formed to be substantially flat.

A bank (or separation wall) 166 can be formed on the first electrode 165 along a boundary of each pixel region P and surround each pixel region P. The bank 166 can have an opening exposing the first electrode 165 in each pixel region P and cover an edge portion of the first electrode 165.

In other words, the edge portion of the first electrode 165 and an edge portion of the reflective electrode 150 can be located below the bank 166 to be covered by the bank 166, the edge portions of the first electrode 165 and the reflective electrode 150 can be not exposed so as not to contact an organic light emitting layer 167.

The bank 166 can be formed to shield (or cover) an edge portion of the concave furrow 144 of the reflective electrode 150. In this regard, when the edge portion of the concave furrow 144 is not shield by the bank 166 and is located on an inner side of the bank 166, a light being bent to a neighboring pixel region can happen and a color mixture can be caused.

The organic light emitting layer 167 can be formed on the first electrode 165 exposed through the opening of the bank 166. The organic light emitting layer 167 can have a multi-layered structure including an emitting material layer.

Since the first electrode 165 is substantially flat, the organic light emitting layer 167 on the first electrode 165 can be formed in a flat state.

The organic light emitting layer 167 formed in each of the red, green and blue pixel regions P can be a white organic light emitting layer emitting a white color. Alternatively, the organic light emitting layers 167 respectively formed in the red, green and blue pixel regions P can red, green and blue organic light emitting layers respectively emitting red, green and blue colors.

In this embodiment, the organic light emitting layer 167 in each of the red, green and blue pixel regions P uses a white organic light emitting layer by way of example.

Alternatively, the organic light emitting layer 167 can be formed to correspond to all the pixel regions P. In other words, the organic light emitting layer 167 can be formed continuously over all the pixel regions P.

A second electrode 169 can be formed on the organic light emitting layer 167 and entirely over the first substrate 101.

The second electrode 169 can be configured as a transmissive (or transparent) electrode. In this case, the second electrode 169 can be made of a transparent conductive material, for example, ITO.

Alternatively, the second electrode 169 can be configured as a semi-transmissive (or semi-transparent) electrode. In this case, a micro cavity effect can be achieved to increase an emission efficiency. In this case, the second electrode 169 can be made of a metal material, for example, magnesium (Mg), silver (Ag) or an alloy of magnesium and silver, and this metal material can be formed at a thin thickness so as to achieve a semi-transmissive property.

Since the organic light emitting layer 167 is formed to be flat, a portion of the second electrode 169 on the organic light emitting layer 167 can be flat.

The first electrode 165, the organic light emitting layer 167 and the second electrode 169 form the organic light emitting diode OD in the pixel region P. One of the first and second electrodes serves as an anode, and the other one of the first and second electrodes serves as a cathode.

A third passivation layer 170 can be formed on the second electrode 169 and entirely over the first substrate 101. The third passivation layer 170 can serve to prevent penetration of an external moisture or oxygen and increase reliability.

The third passivation layer 170 can be made of an inorganic insulating material, for example, silicon oxide or silicon nitride. Further, the third passivation layer 170 can be formed to have a multi-layered structure including at least one of silicon oxide or silicon nitride.

The second substrate 181 can be located on the third passivation layer 170. An adhesive layer 183 can be formed between an inner surface of the third passivation layer 170 and an inner surface of the second substrate 181.

A color filter layer 190 can be located on an outer surface of the second substrate 181 to implement a color of each pixel region P. The color filter layer 190 can include, for example, red, green and blue color filter patterns 190r, 190g and 190b that respectively correspond to the red, green and blue pixel regions P.

Accordingly, a white light from the organic light emitting diode OD that emits the white light passes through each of the corresponding red, green and blue color filter patterns 190r, 190g and 190b so that each of the red, green and blue colors can be output.

Further, a black matrix 185 can be formed along a boundary of each pixel region P on the outer surface of the second substrate 181.

As described above, in this embodiment, the reflective electrode 150 having the concave structure is formed below the organic light emitting diode OD in the light emission region.

Accordingly, the reflective electrode 150 serves as a concave mirror and thus can output an incident light substantially vertically in an upward direction.

Figure 4:
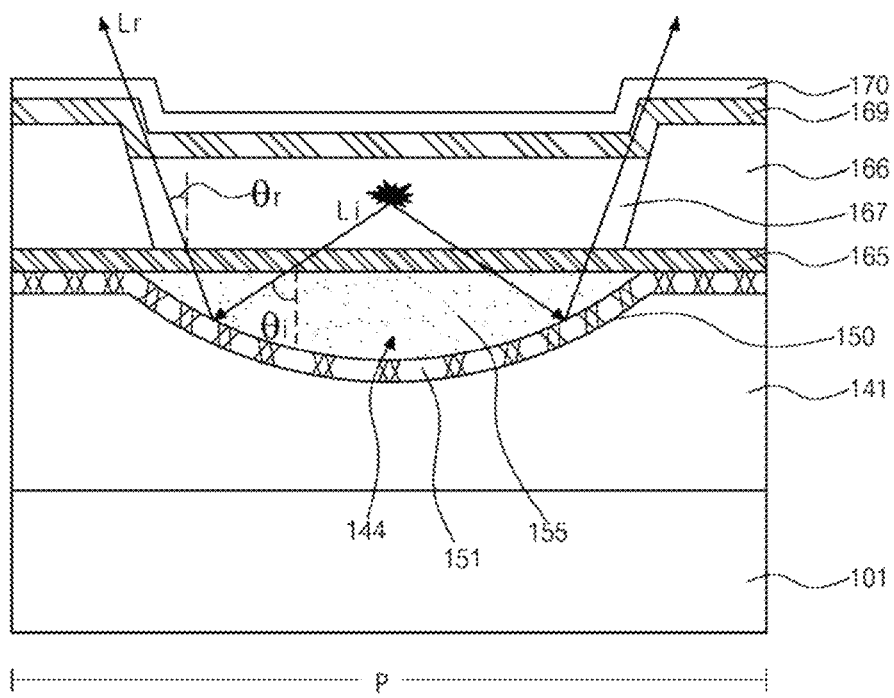
FIG. 4 is a view illustrating a path of a light reflected by a reflective electrode according to an embodiment of the present invention.

For example, FIG. 4 is a view illustrating a path of a light reflected by the reflective electrode according to an embodiment of the present invention. In FIG. 4, for the purpose of explanations, some components of the OLED 100 are omitted.

Referring further to FIG. 4, a light, which is produced at the organic light emitting layer 167 and travels downwardly, is reflected by the reflective electrode 150. The reflective electrode 150 has the concave structure which is dented downwardly, and thus serves as a concave mirror.

Thus, even though an incident angle $\theta i$ of a light Li is great with respect to a normal direction to a surface of a substrate, because of the concave mirror function of the reflective electrode 150 for the light Li, an output angle $\theta r$ becomes small with respect to the normal direction.

Accordingly, a light Lr reflected by the reflective electrode 150 is concentrated and output substantially in a front direction of the OLED 100.

As such, since the reflected light Lr is output substantially within each pixel region P, a color mixture due to a light traveling into a neighboring pixel region can be prevented.

Further, since the output angle $\theta r$ of the reflected light Lr becomes small, a light loss due to a light being guided laterally by total reflection at an interface between stacked layers having different refractive indices can be prevented (or reduced).

In this regard, for example, since the second electrode 169 has a refractive index greater than that of the third passivation layer 170 located on the second electrode 169, in a case that an output angle of a reflected light is great like the related art, a total reflection can happen.

However, in this embodiment, the output angle $\theta r$ of the reflected light Lr becomes small because of the concave reflective electrode 150. Therefore, a light loss due to total reflection can be improved.

Further, in this embodiment, the concave furrow 144 having the reflective electrode 150 therein is filled with the first filling pattern 155 so that a surface of a substrate in the light emission region is substantially flat.

Accordingly, the organic light emitting layer 167 substantially has a uniform thickness. Therefore, a uniform electric field is applied to the entire organic light emitting layer 167, and thus a brightness uniformity can be achieved.

Figure 5:
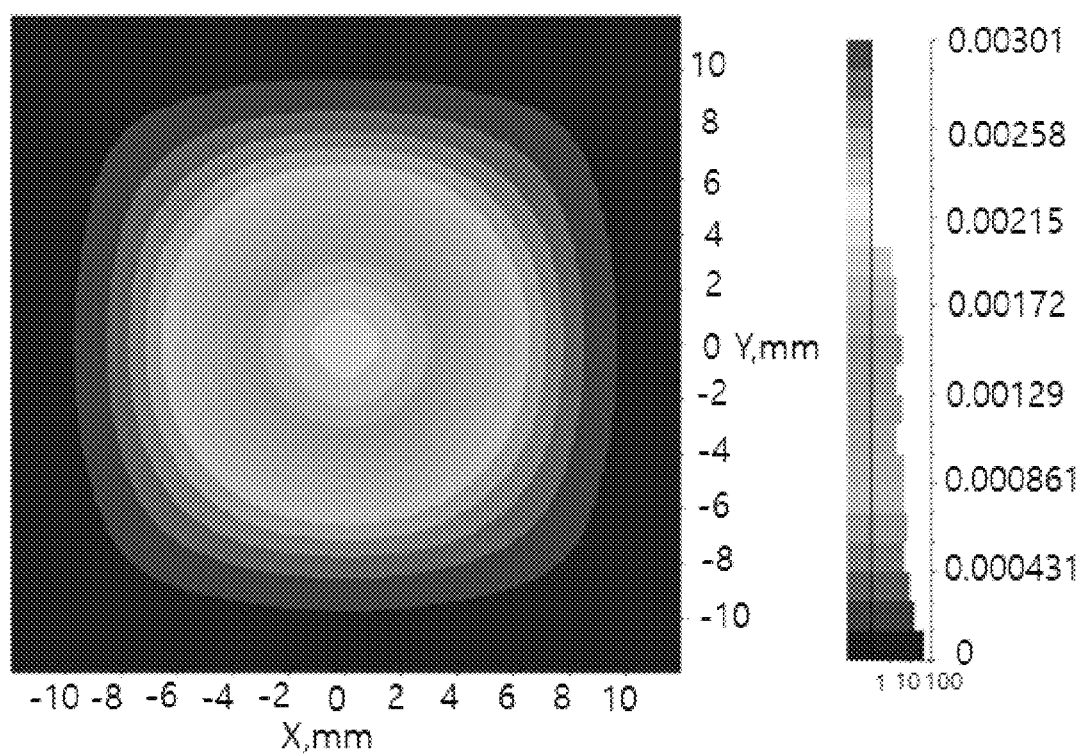
FIG. 5 is a view illustrating a simulation result of an output light profile of an organic light emitting display device according to an embodiment of the present invention.

For example, FIG. 5 is a view illustrating a simulation result of an output light profile of an organic light emitting display device (OLED) according to an embodiment of the present invention.

As described above, in this embodiment, the concave furrow 144, in which the reflective electrode 150 is formed, is filled with the first filling pattern 155, thus a surface of a substrate in the light emission region is substantially flat, and thus the organic light emitting layer 167 substantially has a uniform thickness. Accordingly, referring to FIG. 5, it is seen that a profile of a light output from the pixel region P is substantially uniform and thus a brightness uniformity can be achieved.

According to the above-described embodiment, the reflective electrode below the organic light emitting diode is formed to have a concave shape.

Accordingly, the reflective electrode serves as a concave mirror and the output angle of the reflected light becomes small. Thus, a color mixture due to a light traveling into a neighboring pixel region can be improved, and a light loss due to a light being guided laterally by total reflection can be improved.

Further, the concave furrow, in which the reflective electrode is formed, is filled with the filling pattern to make a surface of a substrate substantially flat.

Accordingly, the organic light emitting layer 167 substantially has a uniform thickness, and thus a brightness uniformity can be achieved.

It will be apparent to those skilled in the art that various modifications and variations can be made in the present invention without departing from the sprit or scope of the disclosure. Thus, it is intended that the present invention covers the modifications and variations of this disclosure provided they come within the scope of the appended claims and their equivalents.

What is claimed is:

1. An organic light emitting display device comprising:
   a reflective electrode in a pixel region on a substrate, and including a concave portion defining a concave furrow;
   a first filling pattern filling the concave furrow;
   a first electrode on the first filling pattern and on a portion of the reflective electrode around the first filling pattern;
   an organic light emitting layer on the first electrode;
   a second electrode on the organic light emitting layer;
   a bank disposed on a boundary of the pixel region;
   a passivation layer provided below the reflective electrode, the passivation layer including a concave surface on which the concave portion of the reflective electrode is formed; and
   a second filling pattern filling a drain contact hole of the passivation layer,
   wherein the bank overlaps with an edge portion of the concave furrow of the reflective electrode, wherein a drain electrode of a thin film transistor in the pixel region and the reflective electrode are electrically connected with each other through the drain contact hole, and wherein the second filling pattern is surrounded by the drain electrode, a portion of the reflective electrode and a portion of the first electrode which contacts the portion of the reflective electrode.

2. The organic light emitting display device of claim 1, wherein a top surface of the first filling pattern has a same height as a top surface of the portion of the reflective electrode around the first filling pattern.

3. The organic light emitting display device of claim 1, wherein the organic light emitting layer emits a white light, and wherein a color filter pattern is on the second electrode.

4. The organic light emitting display device of claim 1, wherein the second electrode is transmissive or semi-transmissive.

5. The organic light emitting display device of claim 1, wherein an interface between the reflective electrode and the first electrode is disposed above an uppermost surface of the passivation layer.

6. The organic light emitting display device of claim 1, wherein an uppermost surface of the first filling pattern in the concave furrow of the reflective electrode has a same height as an uppermost surface of the second filling pattern in the drain contact hole of the passivation layer.

7. The organic light emitting display device of claim 1, wherein an upper surface of the second filling pattern contacts a lower surface of the first electrode.

8. The organic light emitting display device of claim 1, wherein the reflective electrode includes a first layer and a second layer.

9. The organic light emitting display device of claim 8, wherein the first layer of the reflective electrode includes indium tin oxide (ITO) and the second layer of the reflective electrode includes silver (Ag).

10. The organic light emitting display device of claim 8, further comprising a passivation layer disposed below the reflective electrode, the passivation layer including a concave surface on which the concave portion of the reflective electrode is formed, wherein the first layer of the reflective electrode is disposed between the passivation layer and the second layer of the reflective electrode.

11. The organic light emitting display device of claim 1, further comprising a black matrix overlapping with a portion of the first electrode and a portion of the reflective electrode.

12. The organic light emitting display device of claim 1, further comprising an upper passivation layer disposed on the second electrode, wherein a refractive index of the second electrode is greater than a refractive index of the upper passivation layer.

13. The organic light emitting display device of claim 1, wherein the portion of the first electrode is below the bank.

14. An organic light emitting display device comprising:
a reflective electrode in a pixel region on a substrate, and including a concave portion defining a concave furrow;
a first filling pattern filling the concave furrow;
a first electrode on the first filling pattern and on a portion of the reflective electrode around the first filling pattern;
an organic light emitting layer on the first electrode;
a second electrode on the organic light emitting layer;
a passivation layer disposed below the reflective electrode, the passivation layer including a concave surface on which the concave portion of the reflective electrode is formed; and
a second filling pattern filling a drain contact hole of the passivation layer,
wherein a drain electrode of a thin film transistor in the pixel region and the reflective electrode are electrically connected to each other via the drain contact hole, and
wherein an uppermost surface of the first filling pattern in the concave furrow of the reflective electrode has a same height as an uppermost surface of the second filling pattern in the drain contact hole of the passivation layer.

15. The organic light emitting display device of claim 14, wherein the reflective electrode includes a first layer and a second layer.

16. The organic light emitting display device of claim 15, wherein the first layer includes indium tin oxide (ITO) and the second layer includes silver (Ag).

17. The organic light emitting display device of claim 14, further comprising a black matrix overlapping with a portion of the first electrode and a portion of the reflective electrode.

* * * * *